United States Patent
Ping et al.

(10) Patent No.: US 12,096,617 B2
(45) Date of Patent: Sep. 17, 2024

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Er-Xuan Ping, Hefei (CN); Jie Bai, Hefei (CN); Juanjuan Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 160 days.

(21) Appl. No.: 17/650,130

(22) Filed: Feb. 7, 2022

(65) Prior Publication Data
US 2022/0223603 A1    Jul. 14, 2022

Related U.S. Application Data

(63) Continuation of application No. PCT/CN2021/111383, filed on Aug. 9, 2021.

(30) Foreign Application Priority Data

Jan. 14, 2021   (CN) .......................... 202110050700.1

(51) Int. Cl.
*H01L 27/108*   (2006.01)
*H10B 12/00*   (2023.01)

(52) U.S. Cl.
CPC ........... *H10B 12/482* (2023.02); *H10B 12/30* (2023.02)

(58) Field of Classification Search
CPC .............................. H10B 12/482; H10B 12/30
See application file for complete search history.

(56) References Cited

U.S. PATENT DOCUMENTS

| | | | |
|---|---|---|---|
| 9,236,263 | B2 | 1/2016 | Rouh et al. |
| 10,373,961 | B2 | 8/2019 | Yoon et al. |
| 2001/0050386 | A1 | 12/2001 | Suzuki et al. |
| 2007/0023821 | A1 | 2/2007 | Kim et al. |
| 2007/0045854 | A1 | 3/2007 | Lim et al. |
| 2012/0025300 | A1 | 2/2012 | Chung et al. |
| 2012/0108034 | A1 | 5/2012 | Bae et al. |

(Continued)

FOREIGN PATENT DOCUMENTS

| | | |
|---|---|---|
| CN | 101330042 A | 12/2008 |
| CN | 102456646 A | 5/2012 |

(Continued)

OTHER PUBLICATIONS

International Search Report cited in PCT/CN2021/111383 mailed Nov. 11, 2021, 9 pages.

(Continued)

*Primary Examiner* — Mohammed R Alam
(74) *Attorney, Agent, or Firm* — Kilpatrick Townsend & Stockton LLP

(57) ABSTRACT

A method of manufacturing a semiconductor structure and a semiconductor structure are disclosed in embodiments of the present disclosure. The method of manufacturing a semiconductor includes: providing a base; and forming an electrical contact layer, a bottom barrier layer, and a conductive layer that are sequentially stacked on the base, where a material of the conductive layer includes molybdenum.

17 Claims, 5 Drawing Sheets

(56) References Cited

U.S. PATENT DOCUMENTS

| | | |
|---|---|---|
| 2013/0168751 A1 | 7/2013 | Lee et al. |
| 2016/0372359 A1* | 12/2016 | Kong ................. H01L 29/4236 |
| 2020/0126996 A1 | 4/2020 | Panda et al. |
| 2020/0127103 A1 | 4/2020 | Kim et al. |
| 2020/0373309 A1 | 11/2020 | Teo |
| 2022/0115377 A1* | 4/2022 | Kim .................... H10B 12/053 |
| 2022/0173108 A1* | 6/2022 | Lee ...................... H01L 23/528 |

FOREIGN PATENT DOCUMENTS

| | | |
|---|---|---|
| CN | 104979275 A | 10/2015 |
| CN | 103579117 B | 7/2018 |
| CN | 108987397 A | 12/2018 |
| CN | 110571188 A | 12/2019 |
| CN | 110571189 A | 12/2019 |
| CN | 110729231 A | 1/2020 |
| CN | 111092081 A | 5/2020 |
| CN | 111834364 A | 10/2020 |
| CN | 112864098 A | 5/2021 |
| KR | 20010065288 A | 7/2001 |
| KR | 20020014490 A | 2/2002 |
| KR | 20050009939 A | 1/2005 |

OTHER PUBLICATIONS

First Office Action cited in CN202110050700.1, mailed May 7, 2022, 17 pages.

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/111383, filed on Aug. 9, 2021, which claims the priority to Chinese Patent Application 202110050700.1, titled "METHOD OF MANUFACTURING SEMICONDUCTOR STRUCTURE AND SEMICONDUCTOR STRUCTURE" and filed on Jan. 14, 2021. The entire contents of International Application No. PCT/CN2021/111383 and Chinese Patent Application 202110050700.1 are incorporated herein by reference.

TECHNICAL FIELD

The present disclosure relates to, but is not limited to, a method of manufacturing a semiconductor structure and a semiconductor structure.

BACKGROUND

The semiconductor structure as a memory is used to store programs and various data information. Random access memory (RAM) is divided into static random access memory (SRAM) and dynamic random access memory (DRAM). The dynamic random access memory usually includes a capacitor and a transistor connected to the capacitor. The capacitor is configured to store charges representing storage information. The transistor is a switch that controls inflow and release of the charges from the capacitor. During data writing, a word line provides a high level, the transistor is turned on, and a bit line charges the capacitor. During data reading, the word line also provides a high level, the transistor is turned on, and the capacitor is discharged, so that the bit line obtains a readout signal.

However, as the process node of the semiconductor structure is reduced continuously, the performance of the semiconductor needs to be further improved.

SUMMARY

An overview of the subject matter detailed in the present disclosure is provided below, which is not intended to limit the protection scope of the claims.

Embodiments of the present disclosure provide a method of manufacturing a semiconductor structure and a semiconductor structure.

According to a first aspect, the embodiments of the present disclosure provide a method of manufacturing a semiconductor structure, including: providing a base; and forming an electrical contact layer, a bottom barrier layer, and a conductive layer that are sequentially stacked on the base, a material of the conductive layer including molybdenum.

According to a second aspect, the embodiments of the present disclosure provide a semiconductor structure, including: a base; an electrical contact layer located on the base; a bottom barrier layer located on the electrical contact layer; and a conductive layer located on the bottom barrier layer, a material of the conductive layer including molybdenum.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

Figure 1:
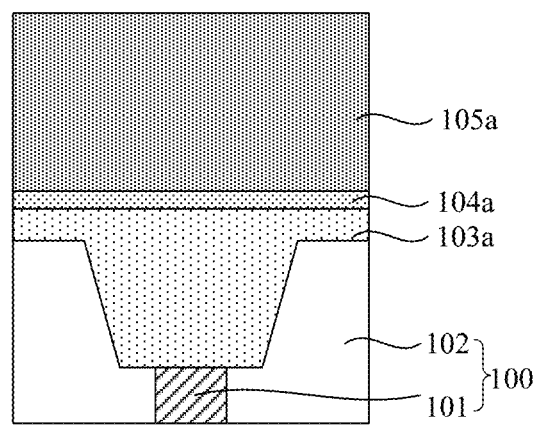
FIG. 1 to FIG. 6 are schematic structural diagrams corresponding to various steps of a method of manufacturing a semiconductor structure according to a first embodiment of the present disclosure.

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the performance of the semiconductor structure in the prior art needs to be improved. Upon analysis, the main reasons are as follows: the resistance of the conductive layer in the semiconductor structure is closely related to the performance of the semiconductor structure; high resistance of the conductive layer leads to poor conductivity of the semiconductor structure. Tungsten is used as the material of the conductive layer in the semiconductor structure, but it becomes increasingly difficult for the resistance of tungsten to meet the requirement of low resistance. The conductive layer made of tungsten easily reacts with the electrical contact layer; therefore, a thicker barrier layer is needed between the electrical contact layer and the conductive layer. In the case of the same volume of the semiconductor structure, the barrier layer occupies a larger space, and the conductive layer occupies a smaller space. Since the resistance of the barrier layer is greater than the resistance of the conductive layer, the semiconductor structure has high total resistance. The step of forming the conductive layer includes an etching process. As the tungsten is easily etched, the side surface of the conductive layer tends to have a depressed shape, resulting in a smaller volume of the conductive layer, which will further increase the resistance of the conductive layer, thus reducing the conductivity of the semiconductor structure.

The embodiments of the present disclosure provide a method of manufacturing a semiconductor structure, including: forming a bottom barrier layer located on an electrical contact layer, and forming a conductive layer located on the bottom barrier layer, a material of the conductive layer including molybdenum. Molybdenum has lower resistance than tungsten, and can reduce the resistance of the conductive layer; the conductive layer of molybdenum is less likely to react with the electrical contact layer. Therefore, a thinner bottom barrier layer can be used, to increase the thickness of the conductive layer and reduce the resistance of the conductive layer. Compared with tungsten, molybdenum is more difficult to etch, so the conductive layer can be provided with a more vertical side profile, which reduces the resistance of the conductive layer and improves the conductivity of the semiconductor structure.

In order to make the objectives, technical solutions and advantages of the embodiments of the present disclosure clearer, the embodiments of the present disclosure are described below with reference to the drawings. Persons skilled in the art may understand that many technical details are proposed in the embodiments of the present disclosure to help readers better understand the present application. However, even without these technical details and various changes and modifications made based on the following embodiments, the technical solutions claimed in the present disclosure may still be realized.

FIG. 1 to FIG. 6 are schematic structural diagrams corresponding to various steps of a method of manufacturing a semiconductor structure according to a first embodiment of the present disclosure. Details are described below with reference to the accompanying drawings.

Referring to FIG. 1, a base 100 is provided.

The base 100 can include an isolation structure 102 and an active region 101. The isolation structure 102 is configured to isolate adjacent active regions 101. A material of the isolation structure 102 is an insulating material, for example, silicon oxide, silicon nitride, silicon nitride or silicon carbide. A material of the active region 101 is a semiconductor material, such as silicon or germanium, and the semiconductor material further includes N-type doped ions or P-type doped ions.

In this embodiment, the base 100 is provided with an inner recess, so that an embedded electrical contact layer can be formed on the active region 101 exposed in the inner recess, thereby reducing the volume of the semiconductor structure and increasing the robustness of the semiconductor structure. In other embodiments, the base may also have a flat shape.

With reference to FIG. 1 to FIG. 4, an electrical contact layer 103, a bottom barrier layer 104, and a conductive layer 105 that are sequentially stacked are formed on the base 100.

The electrical contact layer 103 is located on the active region 101, and is electrically connected to the active region 101. The electrical contact layer 103 is further located in the inner recess of the isolation structure 102, that is, the electrical contact layer 103 is partially embedded in the isolation structure 102.

In this embodiment, a material of the electrical contact layer 103 is polycrystalline silicon. In other embodiments, the material of the electrical contact layer may also be metal or metal silicide.

The bottom barrier layer 104 is configured to electrically connect to the electrical contact layer 103 and the conductive layer 105, and to block the ion diffusion between the electrical contact layer 103 and the conductive layer 105. The bottom barrier layer 104 can further increase the adhesion of the conductive layer 105 to the electrical contact layer 103, thereby improving the robustness of the semiconductor structure.

To reduce the interface defects between the bottom barrier layer 104 and the conductive layer 105, and to further improve the adhesion of the bottom barrier layer 104 to the conductive layer 105, the bottom barrier layer 104 can have the same type of ions as the conductive layer 105. For example, a material of the bottom barrier layer 104 can be molybdenum nitride. In other embodiments, the material of the bottom barrier layer may also be titanium nitride, tantalum nitride, or tungsten nitride.

The conductive layer 105 includes a contact region 115 in contact with the bottom barrier layer 104 and a connection region 125 located on the contact region 115. Compared with the connection region 125, the contact region 115 is closer to the bottom barrier layer 104. Therefore, ions in the contact region 115 and ions in the bottom barrier layer 104 are more likely to diffuse and react with each other. In order to reduce the degree of ion diffusion and reaction between the conductive layer 105 and the electrical contact layer 103, molybdenum can be used as the material of the contact region 115.

In this embodiment, the conductive layer 105 is a single-layer structure. That is, the contact region 115 and the connection region 125 of the conductive layer 105 are of an integrated structure, and materials of both the contact region 115 and the connection region 125 are molybdenum. Due to the low resistance of molybdenum, the use of molybdenum as the material of the whole conductive layer 105 can further reduce the resistance of the conductive layer 105. Due to the low affinity between molybdenum and the electrical contact layer 103, the use of molybdenum as the material of the whole conductive layer 105 can further reduce the degree of reaction between the conductive layer 105 and the electrical contact layer 103; since molybdenum is not easy to etch, the use of molybdenum as the material of the whole conductive layer 105 can further improve the verticality of the side surface of the conductive layer 105. In this way, the resistance of the entire semiconductor structure can be reduced and the conductivity of the semiconductor structure can be improved.

In other embodiments, the material of the entire conductive layer can also be a molybdenum alloy. Alternatively, molybdenum can be used as the material of the connection region, and a conductive material such as tungsten, tantalum or titanium can be used as the material of the contact region. Alternatively, a conductive material such as tungsten, tantalum or titanium can be used as the material of the connection region and molybdenum can be used as the material of the contact region.

Steps for forming the electrical contact layer 103, the conductive layer 105, and the bottom barrier layer 104 are described in detail below.

Referring to FIG. 1, an initial electrical contact layer 103a is formed on the base 100. The initial electrical contact layer 103a is formed in the inner recess of the isolation structure 102; the initial electrical contact layer 103a further covers a top surface of the isolation structure 102.

In this embodiment, the initial electrical contact layer 103a is formed using a chemical vapor deposition process, which has a faster deposition speed. In other embodiments, the initial electrical contact layer can also be formed using a physical vapor deposition process.

An initial bottom barrier layer 104a is formed on the initial electrical contact layer 103a. In this embodiment, the initial bottom barrier layer 104a is formed using a reactive magnetron sputtering method in the physical vapor deposition process. The reactive magnetron sputtering method has the advantages of simple equipment, easy control, and strong adhesion. In other embodiments, the initial bottom barrier layer can also be formed using a vacuum vapor deposition or ion plating method in the physical vapor deposition process.

An initial conductive layer 105a is formed on the initial bottom barrier layer. In this embodiment, the initial conductive layer 105a is formed using a reactive magnetron sputtering method in the physical vapor deposition process, and in other embodiments, the initial conductive layer can also be formed by the vacuum vapor deposition or ion plating in the physical vapor deposition process.

Figure 2:
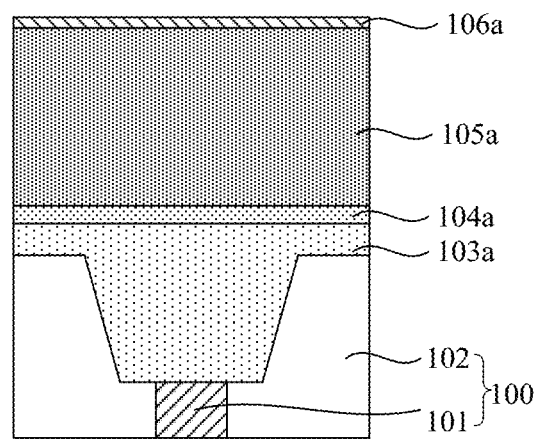

Referring to FIG. 2, in this embodiment, after the initial conductive layer 105a is formed, the method further includes a step of forming an initial top barrier layer 106a on the initial conductive layer 105a. The initial top barrier layer 106a may prevent the initial conductive layer 105a from reacting with a subsequently formed insulation cover layer, to reduce the consumption of the initial conductive layer 105a by the insulation cover layer, thereby reducing the resistance of the semiconductor structure.

In this embodiment, compared with the degree of reaction between the initial conductive layer 105a and the initial electrical contact layer 103a, the degree of reaction between the initial conductive layer 105a and the subsequently formed insulation cover layer is lower. In order to reduce the volume of the initial top barrier layer 106a, the initial top barrier layer 106a may be thinner than the bottom barrier layer 104a, which can increase the volume of the initial conductive layer 105a, thereby reducing the resistance and improving the reaction speed of the semiconductor structure.

The initial conductive layer 105a is processed by using a remote plasma nitridation process, to form the initial top barrier layer 106a. The remote plasma nitridation process means that there is a long distance between an ionization zone and a processing zone, i.e., plasma is synthesized in the ionization zone by using a plasma source, and then the plasma is introduced into the processing zone by an airflow, an electric field, or a magnetic field. In the processing zone, the plasma penetrates or is adsorbed on a top surface of the initial conductive layer 105a to form the initial top barrier layer 106a. The material of the initial top barrier layer 106a is molybdenum nitride. The remote plasma nitridation process has a better plasma processing effect and can form a top barrier layer with a more uniform film thickness and a more appropriate ion ratio.

In other embodiments, the initial top barrier layer may be formed by physical vapor deposition; alternatively, the initial top barrier layer may not be formed on the initial conductive layer.

Figure 3:
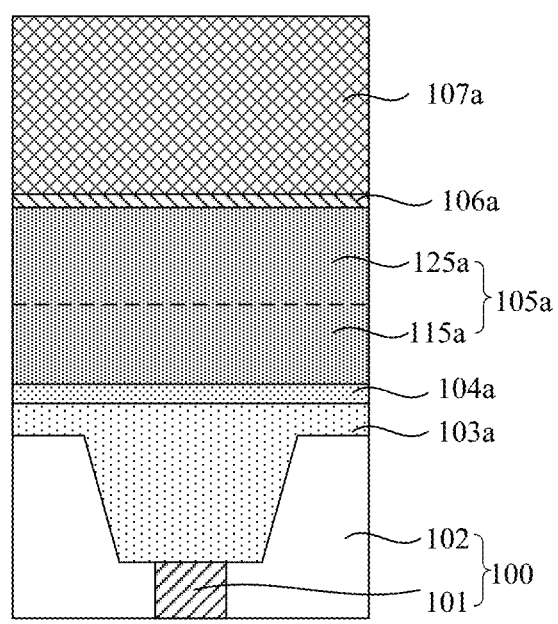

Referring to FIG. 3, an initial insulation cover layer 107a is formed on the initial top barrier layer 106a.

The initial insulation cover layer 107a can protect the initial conductive layer 105a from damage during the subsequent fabrication process. A material of the initial insulation cover layer 107a includes silicon nitride, silicon carbide, silicon carbide or silicon dioxide.

In this embodiment, the initial insulation cover layer 107a is formed by chemical vapor deposition. In other embodiments, the initial insulation cover layer may be formed by physical vapor deposition.

Figure 4:
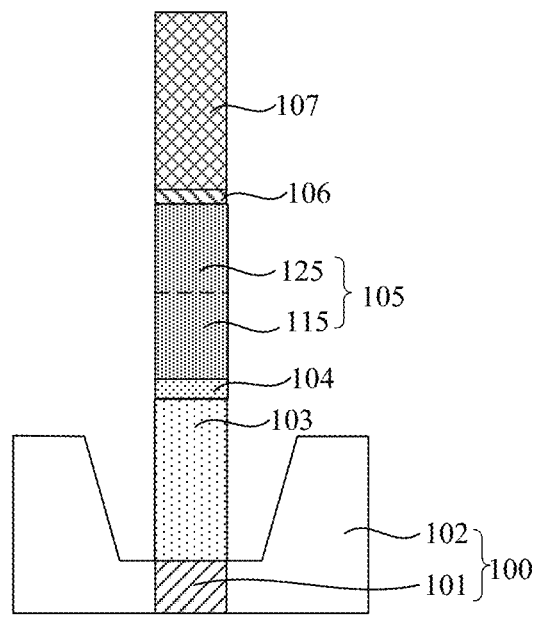

Referring to FIG. 4, the initial electrical contact layer 103a (referring to FIG. 3), the initial bottom barrier layer 104a (referring to FIG. 3), and the initial conductive layer 105a (referring to FIG. 3) are patterned, to form an electrical contact layer 103, a bottom barrier layer 104, and a conductive layer 105.

In this embodiment, the initial top barrier layer 106a (referring to FIG. 3) and the initial insulation cover layer 107a (referring to FIG. 3) are further patterned, to form a top barrier layer 106 and an insulation cover layer 107.

A patterned mask layer is formed on the initial insulation cover layer 107a. Dry etching is performed on the initial electrical contact layer 103a, the initial bottom barrier layer 104a, the initial conductive layer 105a, the initial top barrier layer 106a, and the initial insulation cover layer 107a by using the patterned mask layer as a mask, to form the electrical contact layer 103, the bottom barrier layer 104, the conductive layer 105, the top barrier layer 106, and the insulation cover layer 107 that are sequentially stacked.

In the process of etching the initial insulation cover layer 107a, an etching gas is carbon tetrafluoride.

In the process of etching the initial conductive layer 105a, an etching gas is chlorine, with a flow rate of 10 sccm to 40 sccm; the flow rate within the above range ensures that the etching is completed in a short time, and also ensures a relatively vertical shape of the sidewall of the conductive layer 105.

In the process of etching the initial top barrier layer 106a and the initial bottom barrier layer 104a, an etching gas is at least one of chlorine, argon, nitrogen, etc.

In the process of etching the initial electrical contact layer 103a, an etching gas is chlorine.

Figure 5:
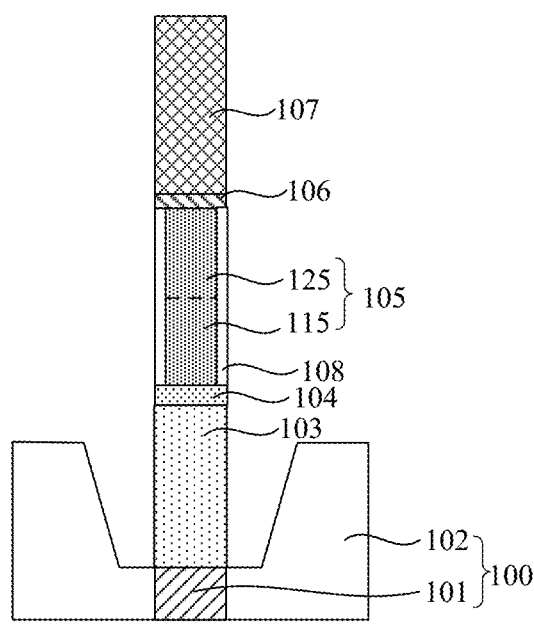

Referring to FIG. 5, in this embodiment, the method may further include a step of forming a sidewall barrier layer 108 on sidewalls of the conductive layer 105 by using a remote plasma nitridation process. The sidewall barrier layer 108 can block the ion diffusion between the conductive layer 105 and a subsequently formed protective layer, thus ensuring low resistance of the conductive layer 105; the sidewall barrier layer 108 can also improve the adhesion between the conductive layer 105 and the subsequently formed protective layer, and improve the robustness of the semiconductor structure.

In this embodiment, the electrical contact layer 103, the conductive layer 105, the top barrier layer 106, the bottom barrier layer 104, and the sidewall barrier layer 108 may form a bit line structure.

Figure 6:
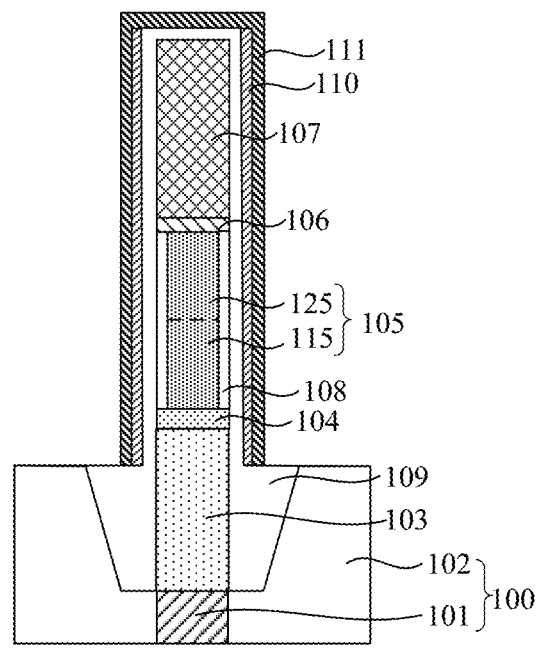

Referring to FIG. 6, a protective layer 109 is formed. The protective layer 109 covers a top surface and sidewalls of the insulation cover layer 107. The protective layer 109 is further located on sidewalls of the top barrier layer 106, sidewalls of the sidewall barrier layer 108, sidewalls of the bottom barrier layer 104, and sidewalls of the electrical contact layer 103. The protective layer 109 further fills the inner recess of the base 100.

The protective layer 109 can isolate the bit line structure from the subsequently formed semiconductor structure. A material of the protective layer 109 may be silicon nitride, silicon nitride oxide or silicon carbon nitride.

A dielectric layer 110 is formed on sidewalls of the protective layer 109. The dielectric layer 110 can reduce the parasitic capacitance between bit line structures, thereby improving the performance of the semiconductor structure. A material of the dielectric layer 110 may be a material with a low dielectric constant.

An insulation layer 111 is formed on sidewalls of the dielectric layer 110 and a top surface of the protective layer 109. The insulation layer 111 may isolate the bit line structure from a subsequently capacitance contact layer, so as to avoid an electrical connection between the bit line structure and the capacitance contact layer.

In summary, the conductive layer 105 of the first embodiment of the present disclosure is a single-layer structure, and the material of the entire conductive layer 105 is molybdenum, which can further reduce the resistance of the conductive layer 105, further reduce the degree of reaction between the conductive layer 105 and the electrical contact layer 103, and improve the verticality of the sidewalls of the conductive layer 105, thereby improving the performance of the semiconductor structure.

A second embodiment of the present disclosure provides a method of manufacturing a semiconductor structure. This embodiment is generally the same as the first embodiment, except that in this embodiment, the conductive layer is a multi-layer structure; the conductive layer includes a contact region in contact with the bottom barrier layer and a connection region located on the contact region; a material of the contact region includes molybdenum, and an etching rate of the connection region is higher than an etching rate of the contact region under the same etching condition.

FIG. 7 to FIG. 10 show the method of manufacturing a semiconductor structure according to the second embodiment of the present disclosure. For the parts of this embodiment that are the same as or similar to the first embodiment, refer to the first embodiment. Details are not described herein again.

Figure 7:
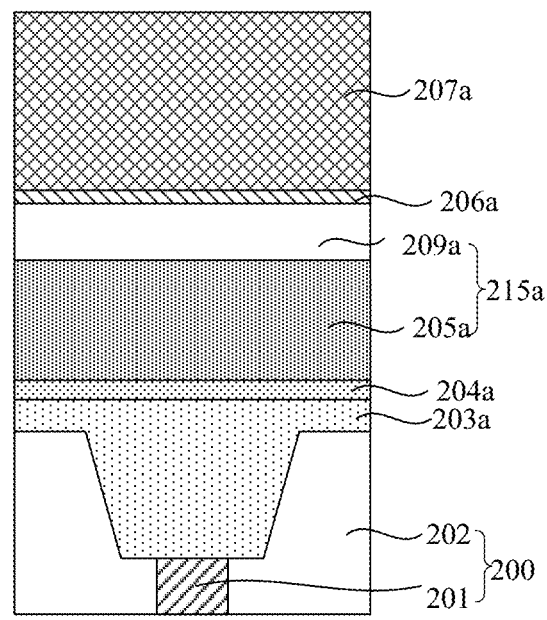
FIG. 7 to FIG. 10 are schematic structural diagrams corresponding to various steps of a method of manufacturing a semiconductor structure according to a second embodiment of the present disclosure.
Figure 8:
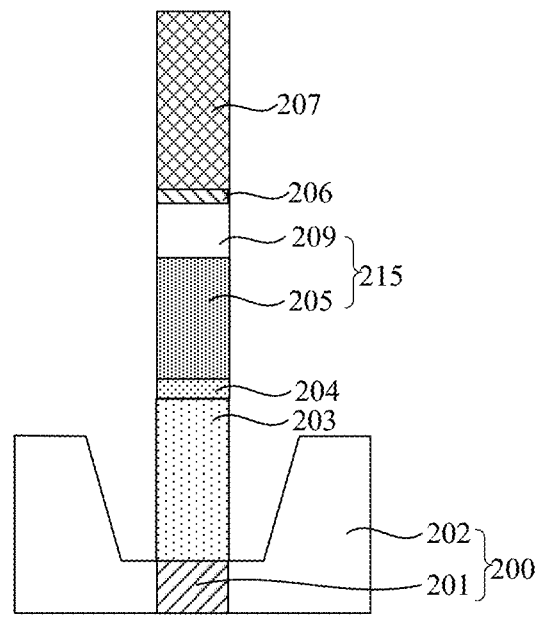

Referring to FIG. 7 to FIG. 8, an electrical contact layer 203, a bottom barrier layer 204, and a conductive layer 215 that are sequentially stacked are formed on a base 200.

Referring to FIG. 7, the base 200 includes an active region 201 and an isolation structure 202 that isolates adjacent active regions 201.

An initial electrical contact layer 203a, an initial bottom barrier layer 204a, an initial conductive layer 215a, an initial top barrier layer 206a, and an initial insulation cover layer 207a that are sequentially stacked are formed on the base 200. The initial conductive layer 215a includes an initial contact region 205a and an initial connection region 209a that are sequentially stacked.

Referring to FIG. 8, patterning is performed to form an electrical contact layer 203, a bottom barrier layer 204, a conductive layer 215, a top barrier layer 206, and an insulation cover layer 207 that are sequentially stacked.

For details of the structure of the base 200 and the steps for forming the electrical contact layer 203, the bottom barrier layer 204, the conductive layer 215, the top barrier layer 206, and the insulation cover layer 207, refer to the first embodiment.

In this embodiment, the conductive layer 215 is a multi-layer structure. The conductive layer 215 includes a contact region 205 in contact with the bottom barrier layer 204 and a connection region 209 located on the contact region 205. A material of the contact region 205 is molybdenum. Due to the low affinity of molybdenum with the electrical contact layer 203, the material, which is in direct contact with the contact region 205, is molybdenum in the electrical contact layer 203. This can reduce the degree of reaction between the conductive layer 215 and the electrical contact layer 203. Since molybdenum is difficult to etch, the use of molybdenum as the material of the contact region 205 can improve the verticality of the sidewalls of the contact region 205. In other embodiments, the material of the contact region may be a molybdenum alloy.

Under the same etching condition, an etching rate of the connection region 209 is higher than an etching rate of the contact region 205. It can be understood that, since the contact region 205 is difficult to etch, a higher etching rate of the connection region 209 can reduce the etching time of the conductive layer 215 to some extent, thereby improving the process efficiency and reducing the production cost.

In this embodiment, a material of the connection region 209 is tungsten; in other embodiments, the material of the connection region may also be tantalum.

In a direction perpendicular to the base 200, a thickness ratio between the contact region 205 and the connection region 209 can be controlled within a range from 2:1 to 3:1. It can be understood that a middle region of the initial conductive layer 215a has a larger contact area with the etching gas. Therefore, the sidewalls in the middle region have a higher risk of over-etching than in the top and bottom regions. If the material in the middle region is molybdenum, which is more difficult to etch, the sidewalls are less likely to be over-etched. When the thickness ratio between the contact region 205 and the connection region 209 is in the range of 2:1 to 3:1, i.e., the thickness ratio between the initial contact region 205a and the initial connection region 209a is in the range of 2:1 to 3:1, the initial contact region 205a can occupy more of the middle region of the initial conductive layer 215a, while the initial connection region 209a mainly occupies the top region of the initial conductive layer 215a. In this way, the verticality of the sidewalls of the conductive layer 215 can be further improved. The thickness ratio within the above range can also control the etching time to be in a smaller range.

In this embodiment, in the process of etching the initial contact region 205a, an etching gas is chlorine, with an etching flow rate of 10 sccm to 40 sccm. Within the etching flow rate range described above, the process time can be reduced to some extent, and the formed contact region 205 can be guaranteed to have a vertical sidewall shape.

In the process of etching the initial connection region 209a, an etching gas is chlorine, with an etching flow rate of 5 sccm to 20 sccm. Within the etching flow rate range described above, the process time can be reduced to some extent, and the formed connection region 209 can be guaranteed to have a vertical sidewall shape.

Figure 9:
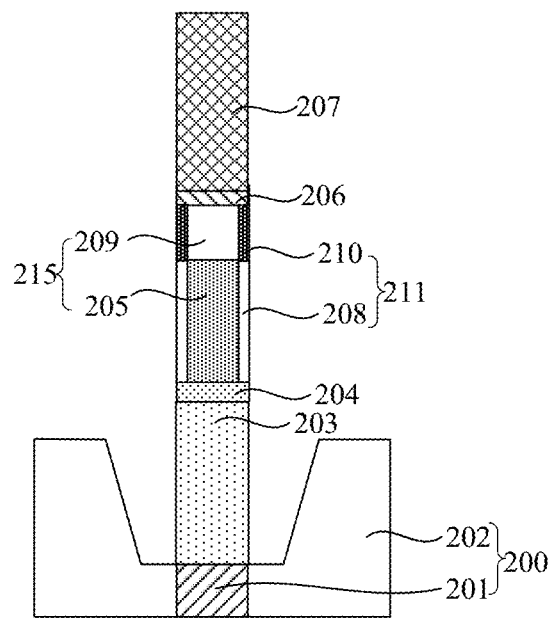

Referring to FIG. 9, a sidewall barrier layer 211 is formed by using a remote plasma process. The sidewall barrier layer 211 is configured to block the ion diffusion between the conductive layer 215 and a subsequently formed protective layer and improve the adhesion between the conductive layer 215 and the protective layer, thereby improving the performance of the semiconductor structure.

The sidewall barrier layer 211 includes a first barrier layer 208 located on sidewalls of the contact region 205 and a second barrier layer 210 located on sidewalls of the connection region 209. In this embodiment, a material of the first barrier layer 208 is molybdenum nitride, and a material of the second barrier layer 210 is tungsten nitride.

Figure 10:
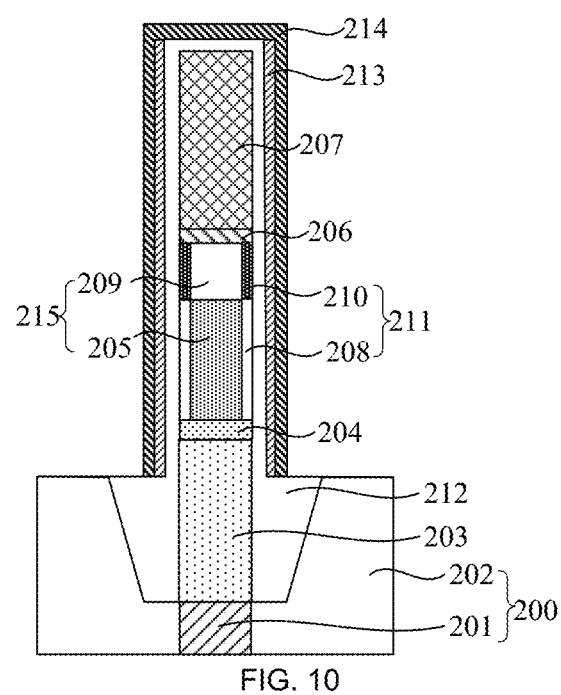

Referring to FIG. 10, a protective layer 212 is formed. The protective layer 212 covers a top surface and sidewalls of the insulation cover layer 207. The protective layer 212 is further located on sidewalls of the top barrier layer 206, sidewalls of the sidewall barrier layer 211, sidewalls of the bottom barrier layer 204, and sidewalls of the electrical contact layer 203. The protective layer 212 further fills the inner recess of the base 200.

A dielectric layer 213 is formed on sidewalls of the protective layer 212.

An insulation layer 214 is formed on sidewalls of the dielectric layer 213 and a top surface of the protective layer 212.

For detailed descriptions of the foregoing steps, refer to the first embodiment.

In conclusion, in this embodiment, the conductive layer 215 is a multi-layer structure, including a contact region 205 and a connection region 209 that are stacked. The etching rate of the connection region 209 is higher than the etching rate of the contact region 205. The material of the contact region is molybdenum, and the material of the connection region 209 is tungsten. With the advantages of the two materials, the degree of reaction between the contact region 205 and the electrical contact layer 203 is reduced, and the resistance of the conductive layer 215 is reduced. Moreover, the etching time is reduced.

A third embodiment of the present disclosure provides a semiconductor structure. FIG. 10 is a schematic diagram of a semiconductor structure according to an embodiment of the present disclosure. Referring to FIG. 10, the semiconductor structure includes: a base 200; an electrical contact layer 203 located on the base 200; a bottom barrier layer 204 located on the electrical contact layer 203; and a conductive layer 215 located on the bottom barrier layer 204, a material of the conductive layer 215 including molybdenum.

Details are described below with reference to the accompanying drawings.

The base 200 may include an isolation structure 202 and an active region 201. The isolation structure 202 is configured to isolate adjacent active regions 201. A material of the isolation structure 202 is an insulating material, for example, silicon oxide, silicon nitride, silicon nitride or silicon carbide. A material of the active region 201 is a semiconductor material, such as silicon or germanium, and the semiconductor material further includes N-type doped ions or P-type doped ions.

In this embodiment, the base 200 is provided with an inner recess, so that an embedded electrical contact layer 203 can be formed in the inner recess, thereby reducing the volume of the semiconductor structure and increasing the robustness of the semiconductor structure. In other embodiments, the base 200 may also have a flat shape.

The electrical contact layer 203 is electrically connected to the active region 201. A material of the electrical contact layer 203 is polycrystalline silicon. In other embodiments, the material of the electrical contact layer may also be metal or metal silicide.

In this embodiment, the conductive layer 215 is a multi-layer structure. The conductive layer 215 further includes a contact region 205 in contact with the bottom barrier layer 204 and a connection region 209 located on the contact region 205. A material of the contact region 205 is molybdenum. Due to the low affinity of molybdenum with the electrical contact layer 203, the material, which is in direct contact with the contact region 205, is molybdenum in the electrical contact layer 203. This can reduce the degree of reaction between the conductive layer 215 and the electrical contact layer 203. Since molybdenum is difficult to etch, the use of molybdenum as the material of the contact region 205 can improve the verticality of the sidewalls of the contact region 205. In other embodiments, the material of the contact region may be a molybdenum alloy.

Under the same etching condition, an etching rate of the connection region 209 is higher than an etching rate of the contact region 205. It can be understood that, since the contact region 205 is difficult to etch, a higher etching rate of the connection region 209 can reduce the etching time of the conductive layer 215 to some extent, thereby improving the process efficiency and reducing the production cost.

In this embodiment, a material of the connection region 209 is tungsten; in other embodiments, the material of the connection region may also be tantalum.

The conductive layer 215 has a thickness of 20 nm to 40 nm, such as 30 nm, in a direction perpendicular to a top surface of the base 200. When the thickness of the conductive layer 215 is within the above range, it not only ensures small resistance of the semiconductor structure but also ensures a small volume of the conductive layer, thereby reducing the size of the semiconductor structure.

In other embodiments, referring to FIG. 6, the conductive layer 105 is a single-layer structure. That is, the contact region 115 and the connection region 125 of the conductive layer 105 are of an integrated structure, and materials of both the contact region 115 and the connection region 125 are molybdenum. Due to the low resistance of molybdenum, the use of molybdenum as the material of the whole conductive layer 105 can further reduce the resistance of the conductive layer 105. Due to the low affinity between molybdenum and the electrical contact layer 103, the use of molybdenum as the material of the whole conductive layer 105 can further reduce the degree of reaction between the conductive layer 105 and the electrical contact layer 103; since molybdenum is not easy to etch, the use of molybdenum as the material of the whole conductive layer 105 can further improve the verticality of the side surface of the conductive layer 105. In this way, the resistance of the entire semiconductor structure is reduced and the conductivity of the semiconductor structure is improved.

Referring to FIG. 10, the bottom barrier layer 204 is configured to prevent reaction between the electrical contact layer 203 and the conductive layer 215. It can be understood that if the bottom barrier layer 204 has the same type of ions as the conductive layer 215, there will be fewer defects at the interface between the two and the adhesion can be further improved, thus increasing the robustness of the semiconductor structure. In this embodiment, a material of the bottom barrier layer 204 is molybdenum nitride. In other embodiments, the material of the bottom barrier layer may also be titanium nitride or tantalum nitride.

The semiconductor structure further includes: a top barrier layer 206 located on the conductive layer 215. The top barrier layer 206 can prevent the conductive layer 215 from reacting with an insulation cover layer 207, to reduce the consumption of the conductive layer 215 by the insulation cover layer 207, thereby reducing the resistance of the semiconductor structure.

A thickness of the bottom barrier layer 204 is greater than a thickness of the top barrier layer 206. In this embodiment, compared with the degree of reaction between the conductive layer 215 and the electrical contact layer 203, the degree of reaction between the conductive layer 215 and the insulation cover layer 207 is lower. Therefore, in order to reduce the volume of the top barrier layer 206, the top barrier layer 206 may be thinner than the bottom barrier layer 204, which can increase the volume of the conductive layer 215, thereby reducing the resistance and improving the conductivity of the semiconductor structure.

In this embodiment, the bottom barrier layer 204 has a thickness of 1 nm to 5 nm, such as 3 nm, in a direction perpendicular to a top surface of the base 200. When the thickness of the bottom barrier layer 204 is in the range described above, it ensures a good blocking effect of the bottom barrier layer 204 and also ensures a small volume of the bottom barrier layer 204, thereby reducing the resistance of the semiconductor structure.

The top barrier layer 206 has a thickness of 0.1 nm to 1 nm in the direction perpendicular to the top surface of the base. When the thickness of the top barrier layer 206 is in the range described above, it ensures a good blocking effect of the top barrier layer 206 and also ensures a small volume of the top barrier layer 206, thereby reducing the resistance of the semiconductor structure.

The semiconductor structure further includes: a sidewall barrier layer 211 located on sidewalls of the conductive layer 215. In this embodiment, the sidewall barrier layer 211 includes a first barrier layer 208 located on sidewalls of the contact region 205 and a second barrier layer 210 located on sidewalls of the connection region 209. In this embodiment, a material of the first barrier layer 208 is molybdenum nitride, and a material of the second barrier layer 210 is nitride.

The sidewall barrier layer 211 has a thickness of 0.1 nm to 1 nm in a direction parallel to the top surface of the base 200. When the thickness of the sidewall barrier layer 211 is in the range described above, it ensures a good blocking effect of the sidewall barrier layer 211 and also ensures a small volume of the sidewall barrier layer 211, thereby reducing the resistance of the semiconductor structure.

The semiconductor structure further includes: a protective layer 212. The protective layer 212 covers a top surface and sidewalls of the insulation cover layer 207. The protective layer 212 is further located on sidewalls of the top barrier layer 206, sidewalls of the sidewall barrier layer 211, sidewalls of the bottom barrier layer 204, and sidewalls of the electrical contact layer 203. The protective layer 212 further fills the inner recess.

The semiconductor structure further includes: a dielectric layer 213 located on sidewalls of the protective layer 212.

The semiconductor structure further includes: an insulation layer 214 located on sidewalls of the dielectric layer 213 and a top surface of the protective layer 212.

For details about the protective layer 212, the dielectric layer 213, and the insulation layer 214, refer to the first embodiment.

In conclusion, the conductive layer 215 is a multi-layer structure, including a contact region 205 and a connection region 209 that are stacked. The etching rate of the connection region 209 is higher than that of the contact region 205. The material of the contact region 205 is molybdenum, and the material of the connection region 209 is tungsten. With the advantages of the two materials, the degree of reaction between the contact region 205 and the electrical contact layer 203 is reduced, and the resistance of the conductive layer 215 is reduced. Moreover, the etching time can be reduced.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The method of manufacturing a semiconductor structure and the semiconductor structure provided in the embodiments of the present disclosure can reduce the resistance of the semiconductor structure and improve the conductive performance of the semiconductor structure.

The invention claimed is:
1. A semiconductor structure, comprising:
a base;
an electrical contact layer located on the base;
a bottom barrier layer located on the electrical contact layer; and
a conductive layer located on the bottom barrier layer; and,
wherein a material of the conductive layer comprises molybdenum, the conductive layer is a multi-layer structure, the conductive layer comprises a contact region in contact with the bottom barrier layer and a connection region located on the contact region, a material of the contact region comprises molybdenum, and an etching rate of the connection region is higher than an etching rate of the contact region under a same etching condition.

2. The semiconductor structure according to claim 1, wherein a material of the connection region comprises tungsten, and a thickness ratio between the contact region and the connection region ranges from 2:1 to 3:1 in a direction perpendicular to a top surface of the base.

3. The semiconductor structure according to claim 1, wherein the semiconductor structure further comprising: a top barrier layer located on the conductive layer.

4. The semiconductor structure according to claim 3, wherein a thickness of the bottom barrier layer is greater than a thickness of the top barrier layer in a direction perpendicular to a top surface of the base.

5. The semiconductor structure according to claim 4, wherein the thickness of the bottom barrier layer ranges from 1 nm to 5 nm in the direction perpendicular to the top surface of the base; the thickness of the top barrier layer ranges from 0.1 nm to 1 nm in the direction perpendicular to the top surface of the base.

6. The semiconductor structure according to claim 1, wherein the semiconductor structure further comprising: a sidewall barrier layer located on sidewalls of the conductive layer.

7. The semiconductor structure according to claim 6, wherein the sidewall barrier layer has a thickness of 0.1 nm to 1 nm in a direction parallel to a top surface of the base.

8. The semiconductor structure according to claim 1, wherein the conductive layer has a thickness of 20 nm to 40 nm in a direction perpendicular to a top surface of the base.

9. The semiconductor structure according to claim 1, wherein a material of the bottom barrier layer comprises molybdenum nitride.

10. A method of manufacturing a semiconductor structure according to claim 1, comprising:
providing a base; and
forming an electrical contact layer, a bottom barrier layer, and a conductive layer that are sequentially stacked on the base;
wherein a material of the conductive layer comprises molybdenum, the conductive layer is a multi-layer structure, the conductive layer comprises a contact region in contact with the bottom barrier layer and a connection region located on the contact region, a material of the contact region comprises molybdenum, and an etching rate of the connection region is higher than an etching rate of the contact region under a same etching condition.

11. The method of manufacturing the semiconductor structure according to claim 10, wherein a material of the connection region comprises tungsten.

12. The method of manufacturing the semiconductor structure according to claim 10, wherein a thickness ratio between the contact region and the connection region ranges from 2:1 to 3:1 in a direction perpendicular to a top surface of the base.

13. The method of manufacturing the semiconductor structure according to claim 10, wherein a method for forming the electrical contact layer, the conductive layer, and the bottom barrier layer comprises: forming an initial electrical contact layer on the base, and forming an initial bottom barrier layer on the initial electrical contact layer; forming an initial conductive layer on the initial bottom barrier layer; and patterning the initial electrical contact layer, the initial bottom barrier layer, and the initial conductive layer, and forming the electrical contact layer, the conductive layer, and the bottom barrier layer.

14. The method of manufacturing the semiconductor structure according to claim 13, wherein the initial conductive layer is patterned by using a dry etching method, and an etching gas is chlorine, with a flow rate of 10 sccm to 40 sccm, in a process of etching the initial conductive layer.

15. The method of manufacturing the semiconductor structure according to claim 13, wherein after forming the initial conductive layer, the method further comprising:
forming an initial top barrier layer on the initial conductive layer; and
patterning the initial top barrier layer, and forming a top barrier layer.

16. The method of manufacturing the semiconductor structure according to claim 15, wherein the forming the initial top barrier layer on the initial conductive layer comprises: processing the initial conductive layer by using a remote plasma nitridation process to form the initial top barrier layer.

17. The method of manufacturing the semiconductor structure according to claim 10, wherein after forming the conductive layer, the method further comprising: forming a sidewall barrier layer on sidewalls of the conductive layer by using a remote plasma nitridation process.

* * * * *